(12) United States Patent
Clambaneva

(10) Patent No.: US 10,180,731 B2
(45) Date of Patent: Jan. 15, 2019

(54) VIRTUAL CLAY MODELING HAPTIC DEVICE

(71) Applicant: Dassault Systèmes Americas Corp., Waltham, MA (US)

(72) Inventor: Stephan James Clambaneva, New York, NY (US)

(73) Assignee: Dassault Systemes Americas Corp., Waltham, MA (US)

(*) Notice: Subject to any disclaimer, the term of this patent is extended or adjusted under 35 U.S.C. 154(b) by 316 days.

(21) Appl. No.: 14/979,991

(22) Filed: Dec. 28, 2015

(65) Prior Publication Data
US 2017/0185165 A1 Jun. 29, 2017

(51) Int. Cl.
*G06F 3/03* (2006.01)
*G06F 17/50* (2006.01)
(Continued)

(52) U.S. Cl.
CPC .............. *G06F 3/03* (2013.01); *G06F 3/01* (2013.01); *G06F 3/0487* (2013.01); *G06F 17/50* (2013.01);
(Continued)

(58) Field of Classification Search
CPC .. G06F 3/03; G06F 17/50; G06F 2203/04105; G06T 19/20
(Continued)

(56) References Cited

U.S. PATENT DOCUMENTS 3,541,541 A 11/1970 Engelbart
5,923,318 A * 7/1999 Zhai ..................... G06F 3/0346
345/156

(Continued)

FOREIGN PATENT DOCUMENTS

EP 2 538 306 12/2012
WO WO 2011/061511 5/2011

OTHER PUBLICATIONS http://msdn.microsoft.com/en-us/library/windows/desktop/ms645603(v=vs.85).aspx; "MouseMovePoint Structure" retrieved from Internet Dec. 16, 2015.

(Continued)

*Primary Examiner* — Carolyn R Edwards
(74) *Attorney, Agent, or Firm* — Hamilton, Brook, Smith & Reynolds, P.C.

(57) ABSTRACT

The present invention is directed to an input device, system, and method for modeling complex surfaces in a CAD environment. The system and method include a computer communicatively coupled to a user interface, such that the computer is configured to display a modeled surface on the user interface. The system and method further include the input device of the present invention communicatively coupled to the computer by a connection interface. The input device comprises a malleable outer surface that corresponds to the initial modeled surface displayed on the user interface, and a user provides input to the input device by applying pressure to deform the malleable outer surface. The input device further comprises transducers operatively coupled to the malleable outer surface to measure the pressure applied to deform the malleable outer surface. The input device also includes a processor operatively coupled to the transducers to determine displacement of the malleable outer surface based on the measured pressure. The computer of the system and method receives the determined displacement from the connection interface and converts the determined displacement to a corresponding displacement of the displayed modeled surface, such that the displayed modeled surface is updated to reflect the deforming of the malleable outer surface.

20 Claims, 19 Drawing Sheets

(51) Int. Cl.
*G06T 19/20* (2011.01)
*G06F 3/0487* (2013.01)
*G06F 3/01* (2006.01)
*G01L 1/16* (2006.01)

(52) U.S. Cl.
CPC ............... *G06T 19/20* (2013.01); *G01L 1/16* (2013.01); *G06F 2203/04105* (2013.01)

(58) Field of Classification Search
USPC .................................................. 345/156–184
See application file for complete search history.

(56) References Cited

U.S. PATENT DOCUMENTS

| | | | | |
|---|---|---|---|---|
| 7,773,074 B2* | 8/2010 | Arenson | ................. | A61B 8/00 345/173 |
| 8,019,121 B2* | 9/2011 | Marks | ................. | A63F 13/245 3/245 |
| 9,740,305 B2* | 8/2017 | Kabasawa | ............... | G06F 3/016 |
| 2005/0017967 A1* | 1/2005 | Ratti | .................... | G06F 3/0425 345/418 |
| 2007/0066788 A1 | 3/2007 | Hoffmann | | |
| 2011/0157088 A1* | 6/2011 | Motomura | .............. | G06F 3/014 345/174 |
| 2012/0169589 A1* | 7/2012 | Albano | ................. | G06F 3/0346 345/156 |
| 2012/0303839 A1* | 11/2012 | Jackson | ................. | G06F 3/011 710/15 |
| 2012/0319937 A1* | 12/2012 | Lee | ......................... | G06F 1/169 345/156 |
| 2013/0275082 A1* | 10/2013 | Follmer | ................. | G01B 21/00 702/155 |
| 2014/0139328 A1 | 5/2014 | Zellers et al. | | |

OTHER PUBLICATIONS http://reza.moheimani.org/lab/wp-content/uploads/J03a.pdf; Halim D. and Moheimani, Reza S.O., "An optimization approach to optimal placement of collocated piezoelectric actuators and sensors on a thin plate" retrieved from Internet Dec. 16, 2015.

http://www.codeproject.com/Articles/36124/Sensor-API-Make-your-Win-applications-environmen; "Sensor API: Make your Win32 applications environment-aware in Windows 7", retrieved from Internet Dec. 16, 2015.

http://www.technogel.de/index.php?id=183&L=0 "Technogel" retrieved from Internet Dec. 16, 2015.

http://computer.howstuffworks.com/mouse2.htm "How Computer Mice Work" retrieved from Internet Dec. 22, 2015.

European Search Report for application No. EP 16 20 7019 dated Mar. 27, 2017 entitled "Virtual Clay Modeling Haptic Device".

* cited by examiner

VIRTUAL CLAY MODELING HAPTIC DEVICE

BACKGROUND OF THE INVENTION

Computer-aided design (CAD) enables a user to model the complex surfaces of physical real-world objects on a user interface of a computer. Such modeling may involve the computer displaying a basic three-dimensional (3D) shape (e.g., cube or sphere) on the user interface, and the user providing input to the computer to form the 3D shape into the modeled complex surface of the physical real-world object. In order to accurately and efficiently model the complex surface, the user requires use of an input device that provides the user control to form the basic shape into the nonlinear shape of the complex surfaces on the user interface. However, prior input devices allow the user only limited control for inputting the nonlinear shape of the complex surfaces. For example, prior input devices include traditional mouse devices which limit the user to providing linear input in a two-dimensional (2D) plane, as shown in FIG. 1A. Prior input devices further include space mouse devices which do enable the user to provide input in a 3D plane, but still limits the 3D input to linear input, as shown in FIG. 1B. As such, there exists a need in the CAD industry for an input device that provides the user control to accurately and efficiently form the nonlinear shape of a modeled complex surface of a physical real-world object on a user interface.

SUMMARY OF THE INVENTION

To address the issues of prior input devices, the present invention is directed to an input device, computer system, and method that provide the user with improved control to form the nonlinear shape of modeled complex surfaces displayed on a user interface of a computer. The computer system and method may include a computer communicatively coupled to a user interface, such that the computer is configured to display a modeled surface on the user interface. The displayed modeled surface may correspond to the complex surface of a physical real-world object, which may be represented in 3D space on the user interface. The computer system and method may display an initial template of the modeled surface as a basic shape (e.g., cube, sphere, or such), or may load from memory a modeled surface previously formed from the basic shape of the initial template. The computer system and method further include the input device of the present invention.

The input device (e.g., a haptic device) may be communicatively coupled to the computer by a connection interface. The input device may comprise a malleable outer surface that corresponds to the modeled surface displayed on the user interface. The malleable outer surface may comprise the same basic shape displayed as the initial template of the modeled surface on the user interface. The malleable outer surface of the input device may be composed of material similar to known stress balls. For example, the malleable outer surface may be composed of: silicone gel of different densities inside a rubber skin, a thin rubber membrane surrounding a fine powder with malleable properties suited to provide a level of resistance within the rubber membrane, closed-cell polyurethane foam rubber, or other similar materials. The user may provide input to the input device by applying pressure to deform the malleable outer surface. The user may apply the pressure by at least one of: pushing, pulling, poking, squeezing, scraping, and sculpting the malleable outer surface, such that applying the pressure to the malleable outer surfaces simulates molding of the displayed modeled surface with clay (e.g., as an automotive designer would mold clay for a car concept or a sculptor would shape clay into a model).

The input device may further comprise one or more transducers operatively coupled to the malleable outer surface. The one or more transducers are configured to measure (in response to) the pressure applied to deform the malleable outer surface. The one or more transducers may be arranged in an array or grid below the malleable outer surface, such that the transducers measure various points of pressure applied to deform the malleable outer surface. The one or more transducers may be piezoelectric transducers or any other sensor known in the art to measure pressure. The input device also includes a processor operatively coupled to the one or more transducers. The processor is configured to determine displacement of the malleable outer surface based on the measured pressure applied to deform the malleable outer surface. The processor is further configured to transmit the determined displacement via the connection interface to the computer.

The computer of the computer system and method of the present invention may then receive the determined displacement from the connection interface. The computer may convert the determined displacement to a corresponding displacement of the displayed modeled surface, such that the displayed modeled surface is updated on the user interface to reflect the deforming of the malleable outer surface. In some embodiments, the computer converting the determined displacement may comprise calculating the corresponding displacement of the displayed modeled surface by mapping the determined displacement of the malleable outer surface to a respective position on the displayed modeled surface. In these embodiments, the computer may then visually adjust the shape of the displayed model surface according to the calculated displacement.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Computer System for Modeling Complex Surface

Figure 2A:
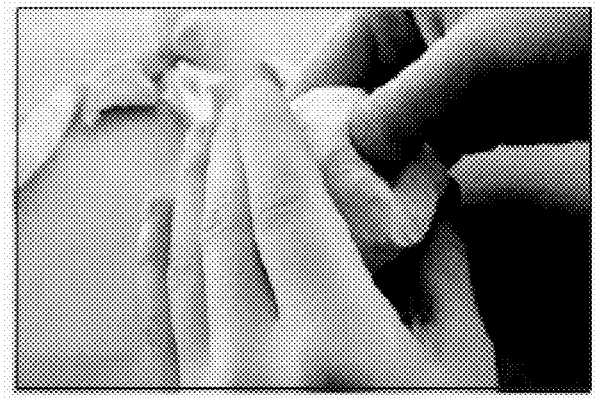
FIGS. 2A-2E are examples of clay molding effects simulated by an input device in embodiments of the present invention.
Figure 2B:
Figure 2C:
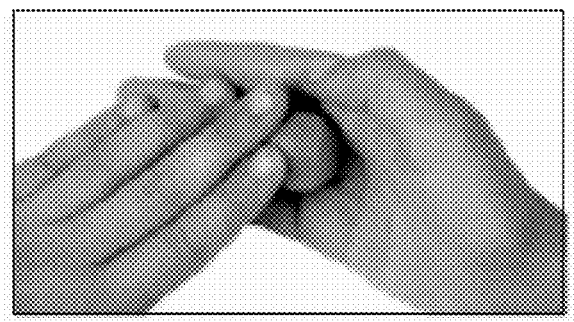
Figure 2D:
Figure 2E:
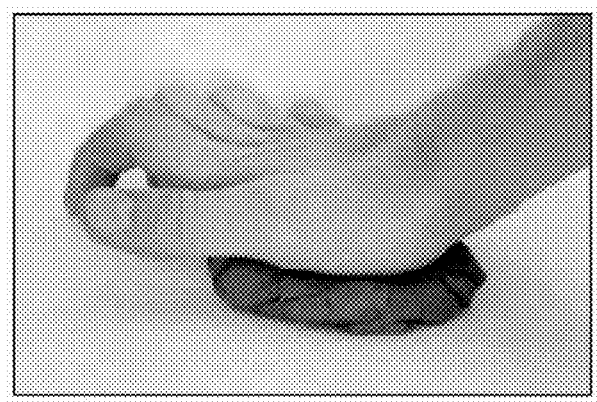
Figure 2F:
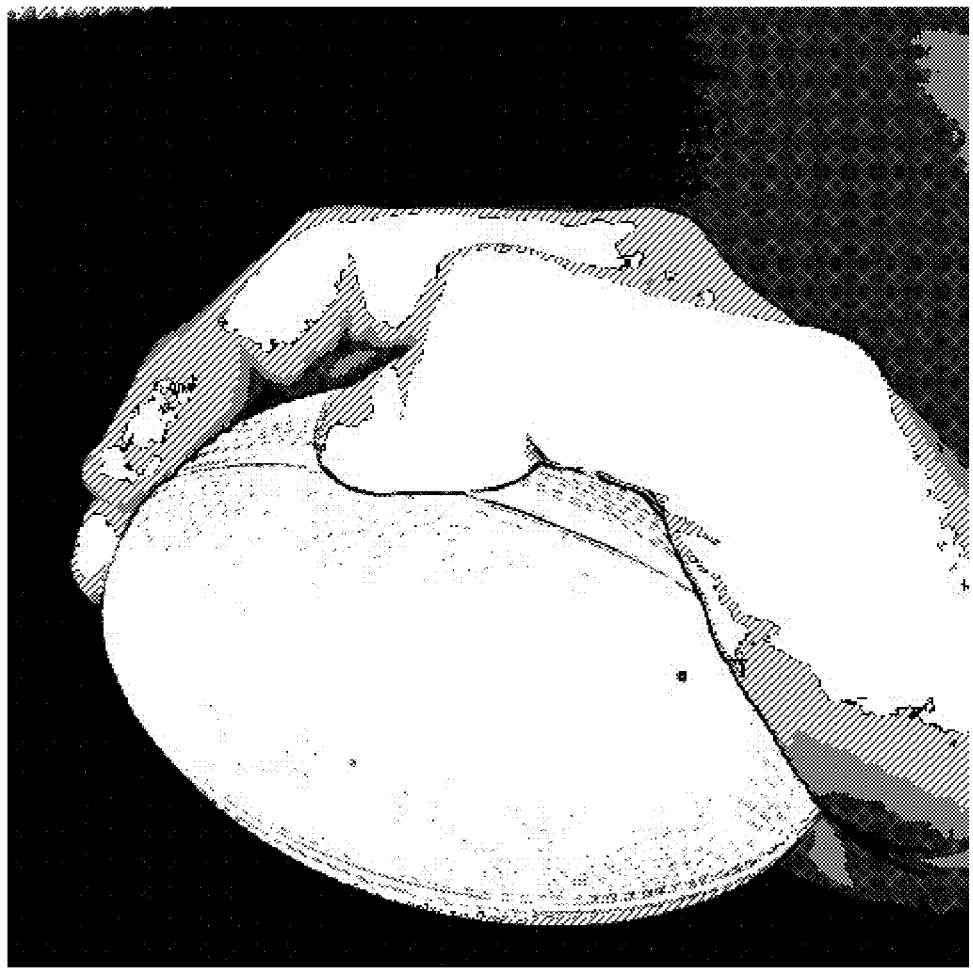
FIGS. 2F-2H are examples of a user applying pressure to deform an input device in embodiments of the present invention.
Figure 2G:
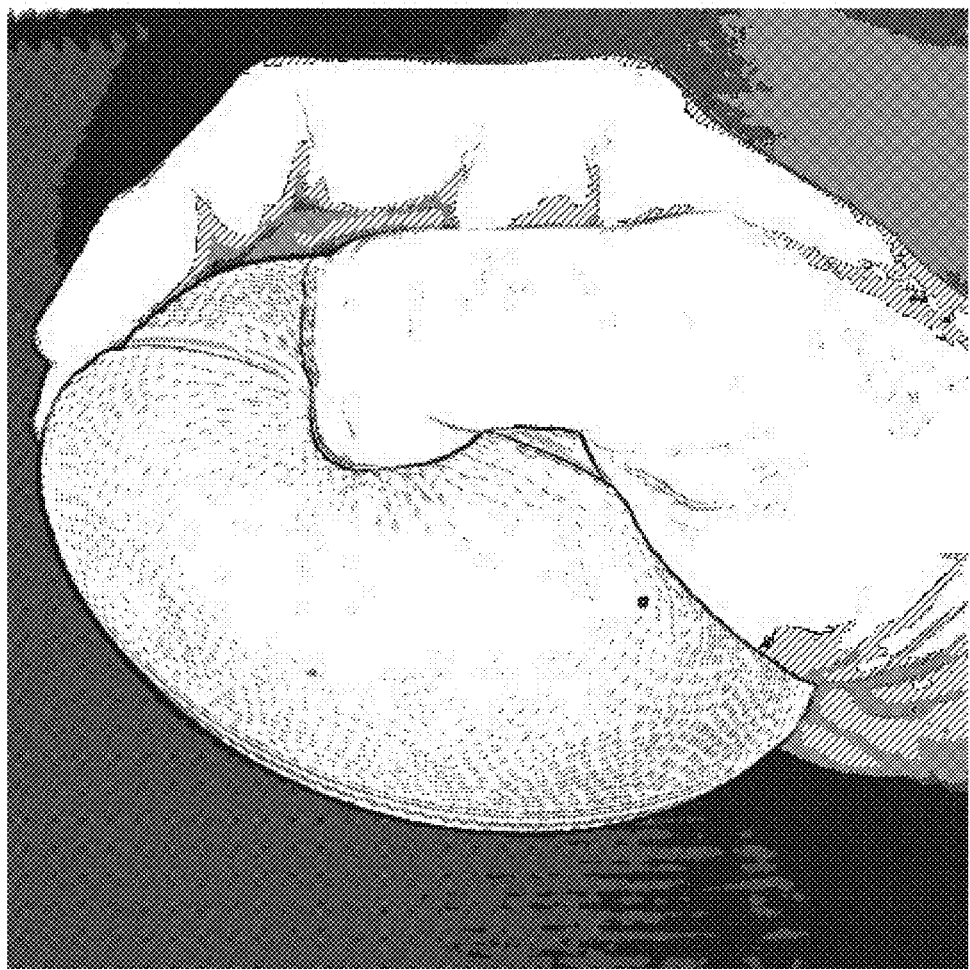
Figure 2H:
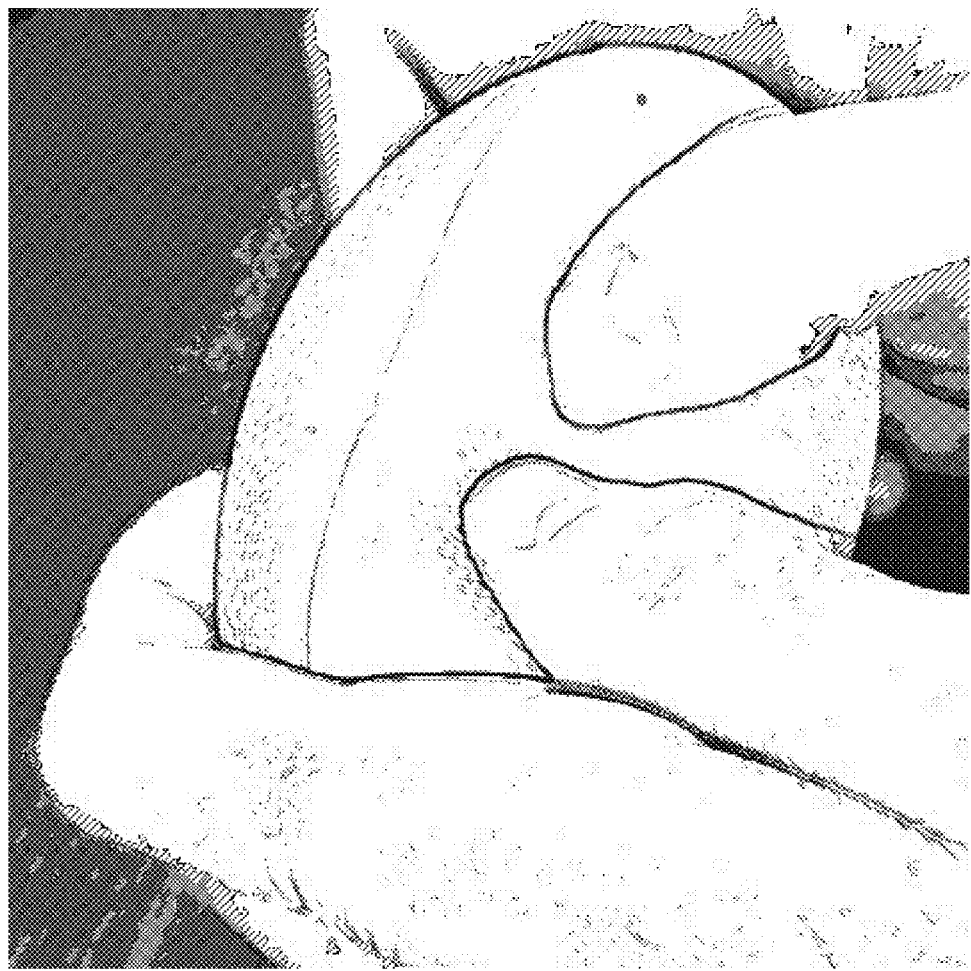

Computer-aided design (CAD) enables a user to model the complex surfaces of physical real-world objects on the user interface of a computer. Such modeling may involve the computer displaying a basic three-dimensional (3D) shape (e.g., cube or sphere) on the user interface, and the user providing input to the computer to form the 3D shape into the modeled surface of the physical real-world object. The user requires use of an input device (e.g., haptic device) that provides the user control to form the basic shape into the nonlinear shape of the complex surfaces on the user interface. The computer system of the present invention includes an input device that enables the user to form the basic shape into the nonlinear shape in a manner that mimics modeling with clay. That is, the user may deform the input device similar to molding clay, as shown in FIGS. 2A-2E, and, because of the material that composes the input device, the deforming may also provide the user the same feeling or sensation as molding clay. The user may deform the input device by applying pressure to an area of the input device, as shown in FIGS. 2F-2H. Further, the user's deforming of the input device provides input to form the basic shape of the modeled surface into the respective nonlinear shape on the user interface, such that the user's deforming of the input device virtually simulates molding of the modeled surface as clay (i.e., virtual clay modeling). Such virtual clay modeling enables the modeling of the complex surface of physical real-world objects, which are often modeled first with clay prototypes, to instead be modeled directly in the CAD system.

Figure 3A:
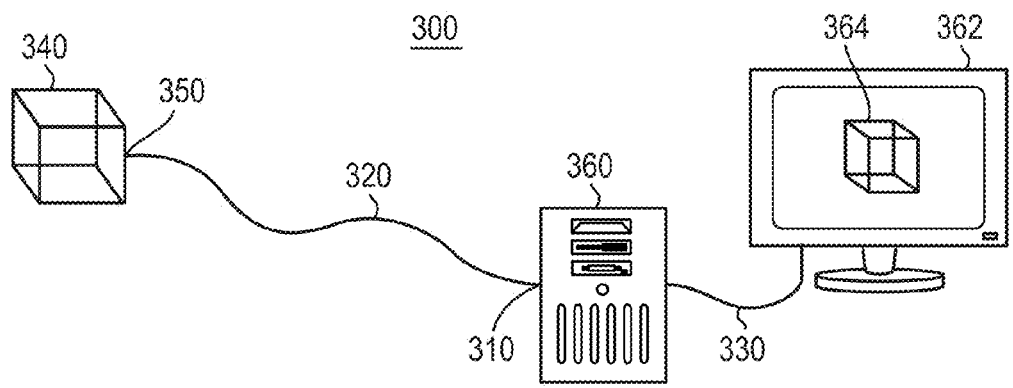
FIGS. 3A-3C are diagrams of an example computer system for virtual clay modeling of surfaces of physical real-world objects in embodiments of the present invention.
Figure 3B:
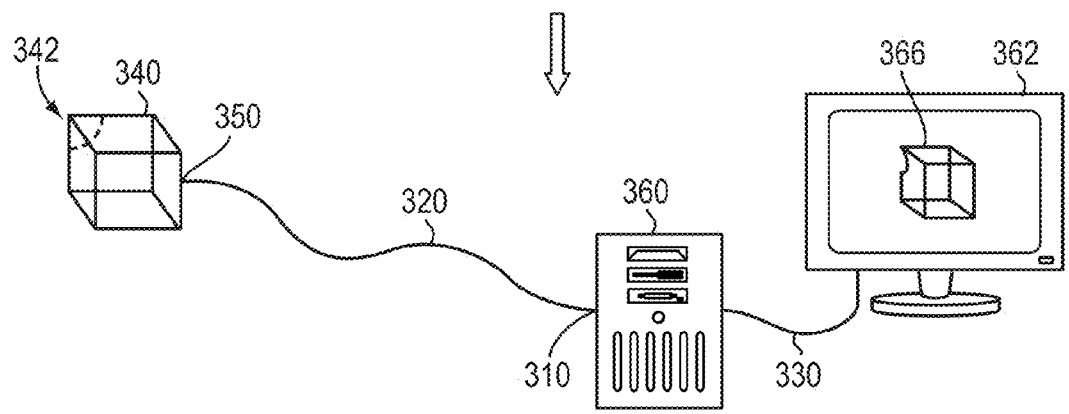
Figure 3C:
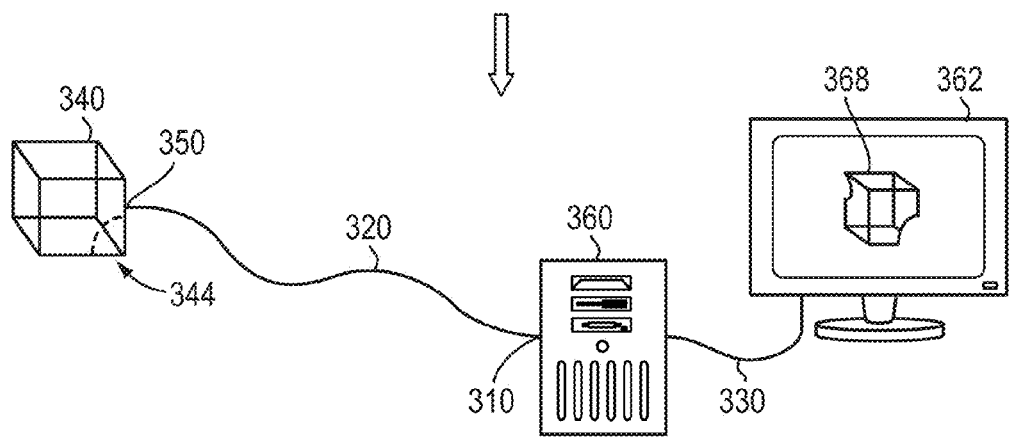

FIGS. 3A-3C are diagrams of an example computer system 300 for virtual clay modeling of surfaces of physical real-world objects in embodiments of the present invention. The computer system 300 includes an input device 340 with a connection interface 350, and a computer 360 with a connection interface 310. The connection interface 350 of the input device 340 is communicative coupled to the connection interface 310 of the computer 360 by connection cable 320. The computer system 300 further includes a display 362 (user interface) communicatively coupled to the computer 360 by connection cable 330. Note, in other embodiments, interface connections 310, 350 and connection cable 320 are replaced or embodied by wireless or Bluetooth connections. In FIG. 3A, the input device 340 is configured as a basic 3D shape (cube) and the computer 360 loads the same basic 3D shape 364 (cube), which the computer 360 displays on user interface 362 (via connection cable 330). The computer 360 loads the basic 3D shape 364 as an initial template from memory on the computer 360, or from another device communicatively coupled to the computer 360, as a modeled surface of a physical real-world object or other such object.

The input device 340 sends displacement data representing input received at the input device 340 over connection cable 320 (via connection interface 350) in packets or other communication format, using standard protocols, such as Universal Serial Bus (USB), to the computer 360 (via connection interface 310). The computer 360 is configured with standard hardware and software to receive the packets at connection interface 310 and retrieve the displacement input data from the packets. The computer 360 is further configured with one or both of a hardware or software mapping interface, such as an application program interface (API), operating system interface, or the like, which enables mapping the displacement input data to a corresponding displacement of the displayed basic 3D shape 364.

The mapping interface is specifically configured (automatically by the computer or by manual input) based on parameters related to the input device 340, such as shape, size, sensitivity of input, and the like. The mapping interface of computer 360 maps the displacement input data to the corresponding displacement of the displayed modeled surface based on these configured parameters, such that the displacement (e.g., position, direction, depth, and such) of the displayed model surface is calculated relative to the corresponding input to the input device 340. Based on the displacement calculated by the mapping interface, the computer 360 communicates visual adjustments to the shape of the displayed modeled surface (e.g., displayed basic 3D shape 364) to the user interface 362 over connection cable 330, which are accordingly displayed by the user interface 362.

For example, in FIG. 3B, the input device 340 detects deforming 342 of the input device 340 by the hand of a user (as shown in FIGS. 2F-2H). The input device 340 sends displacement input data representing the deforming 342 via connection interface 350 over connection cable 320 using a standard protocol. The computer 360 receives the displacement input data (at connection interface 310) by use of standard configured hardware/software, and the mapping interface (e.g., API) maps the displacement input data to corresponding displacement of the displayed basic 3D shape 364. The mapping interface of computer 360 performs the mapping based on configured parameters related to the input device 340, such as its cube shape, its size relative to the displaced basic 3D shape 364, its sensitivity of input, and the like. In this way, the mapping interface calculates displacement (e.g., position, direction, depth, and such) of the displayed basic 3D shape 364 relative to the corresponding deforming 342 of the input device 340. The calculated displacement results in the computer 360 communicating visual adjustments of the basic 3D shape 364 to the user interface 362 (via connection cable 330), which are accordingly displayed as an updated modeled surface 366 by the user interface 362.

Similarly, in FIG. 3C, the input device 340 detects another deforming 344 of the input device 340 by the hand of a user (as shown in FIGS. 2F-2H). The input device 340 sends displacement input data representing the deforming 344 via connection interface 350 over connection cable 320 using a standard protocol. The computer 360 receives the displacement input data (at connection interface 310) by use of standard configured hardware/software, and the mapping interface (e.g., API) maps the displacement input data to corresponding displacement of the currently displayed modeled surface 366. The mapping interface of computer 360 performs the mapping based on the same configured parameters related to the device, such as its cube shape, its size relative to the displayed modeled surface 366, its sensitivity of input, and the like. In this way, the mapping interface calculates displacement (e.g., position, direction, depth, and such) of the displayed modeled surface 366 relative to the corresponding deforming 344 of the input device 340. The calculated displacement results in the computer 360 communicating visual adjustments of the displayed modeled surface to the user interface 362 (via connection cable 330), which are accordingly displayed as an updated modeled surface 368 by the user interface 362.

Figure 1A:
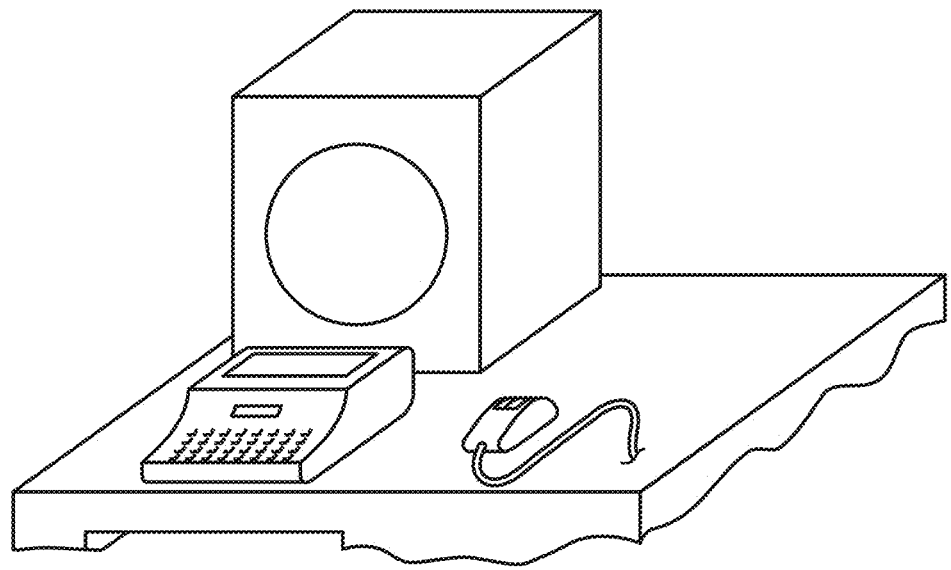
FIGS. 1A and 1B are diagrams of prior art input devices used in CAD systems.
Figure 1A:
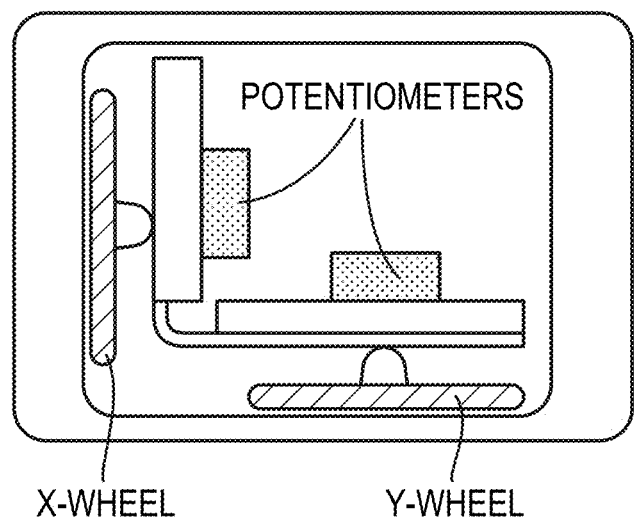
Figure 1B:
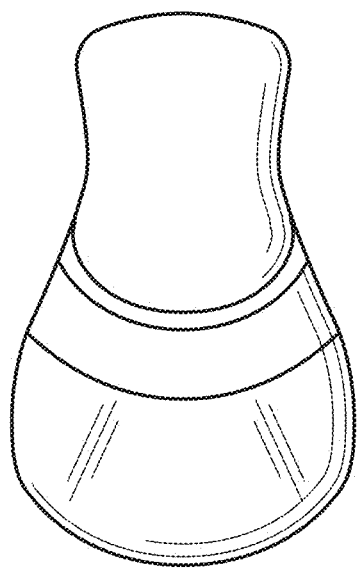
Figure 3D:
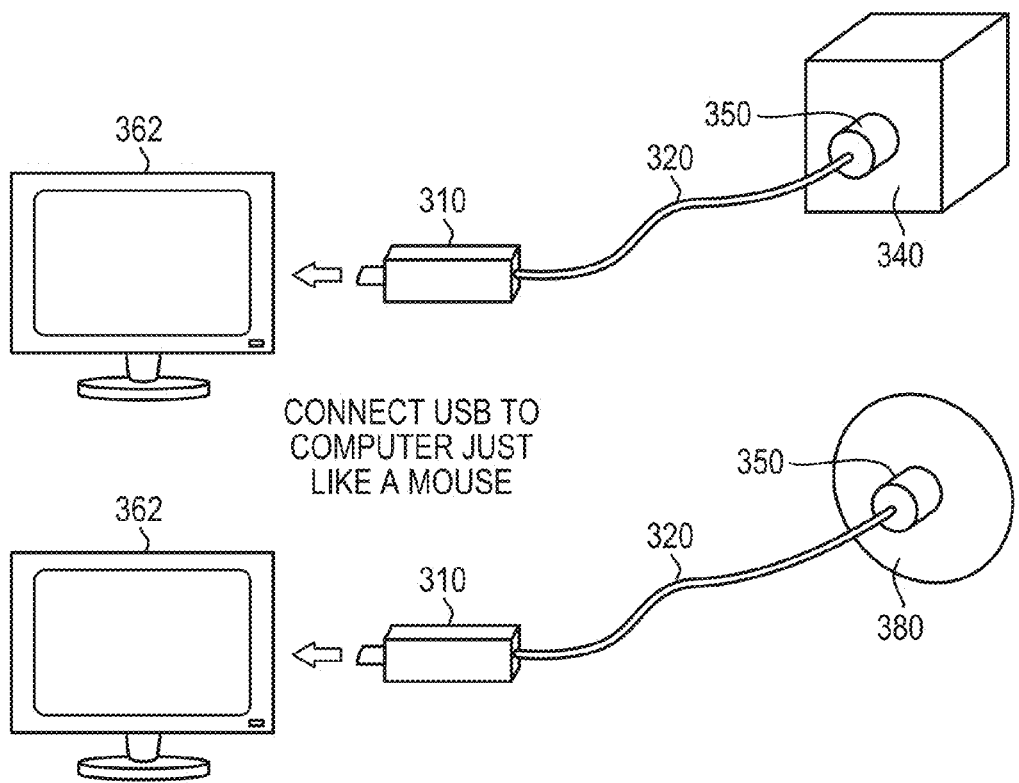
FIG. 3D is a diagram of an example connection interface for communicating data between a computer and input device in embodiments of the present invention.

FIG. 3D is a diagram of an example connection interface for communicating data between the computer 360 (not shown in FIG. 3D) and input device 340 of the computer system 300. FIG. 3D illustrates two example configurations of input devices for use in the computer system 300. The first input device 380 represents a sphere configuration option, and the second input device 340 represents a cube configuration option (as described in relation to FIGS. 3A-3C). Other embodiments of the present invention may include input device configurations of any other basic 3D shape option (e.g., cylinder, pyramid, cone, and such). In the embodiment of FIG. 3D, each of input devices 380, 340, regardless of their shape configuration, is configured with the same USB connection interface 350. As such, each input device 380, 340 may utilize the same standard USB protocols, over the same standard USB cable 320, to communicate input data to a USB connector 310 configured on the computer 360. The configuration of USB connection interfaces 310, 350 on the input devices 380, 340 enables the input devices 380, 340 to standardly connect to the same computers as prior art input devices (e.g., a traditional mouse device of FIG. 1A or space mouse of FIG. 1B). In other embodiments, another or an additional standard connector, cable, and protocol combination (e.g., Human Interface Device, PS/2, or the like) or proprietary connector, cable, and protocol combination may be used to communicate input data between input device 380, 340 and computer 360. In addition, in some embodiments, the input devices 380, 340 may instead utilize a standard or proprietary wireless or Bluetooth connection interface that uses respective wireless/Bluetooth protocols to communicate displacement input data to a wireless/Bluetooth interface of the computer 360 (i.e., without use of a connection cable 320). Further, in some embodiments of the present invention, input devices of different shape configuration options may support different subsets of standard and proprietary connection interfaces, protocols, and cables (if not a wireless or Bluetooth connection).

Method of Modeling Complex Surface

Figure 4A:
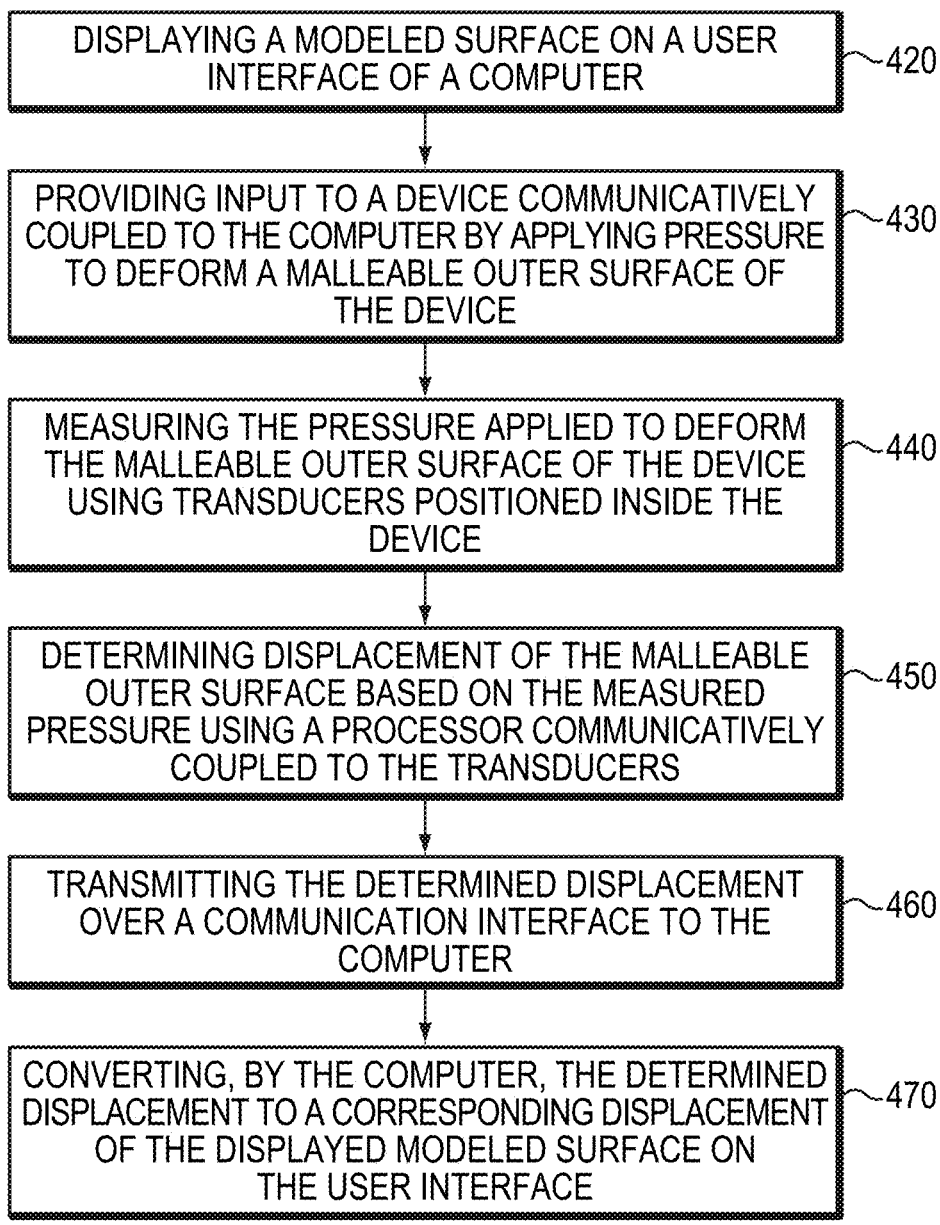
FIG. 4A is a flowchart depicting an example method of virtual clay modeling of surfaces of physical real-world objects in embodiments of the present invention.
Figure 4B:
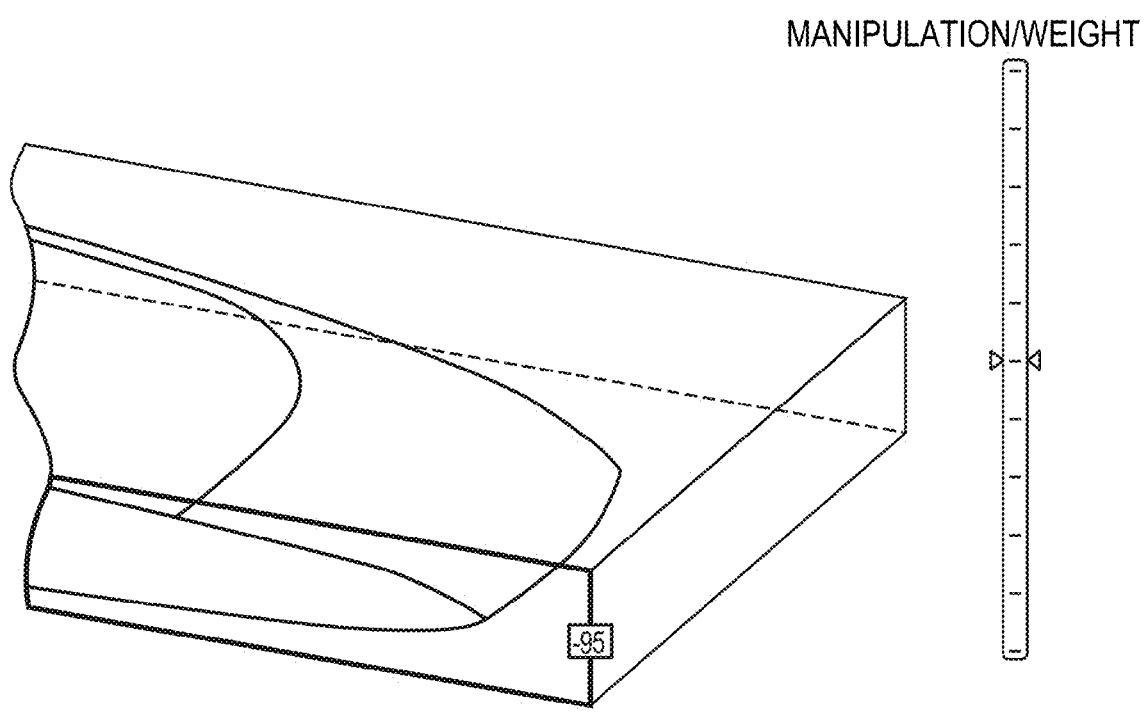
FIGS. 4B-4E are diagrams of example user interfaces to configure parameters for mapping displacements in embodiments of example method 4A.
Figure 4C:
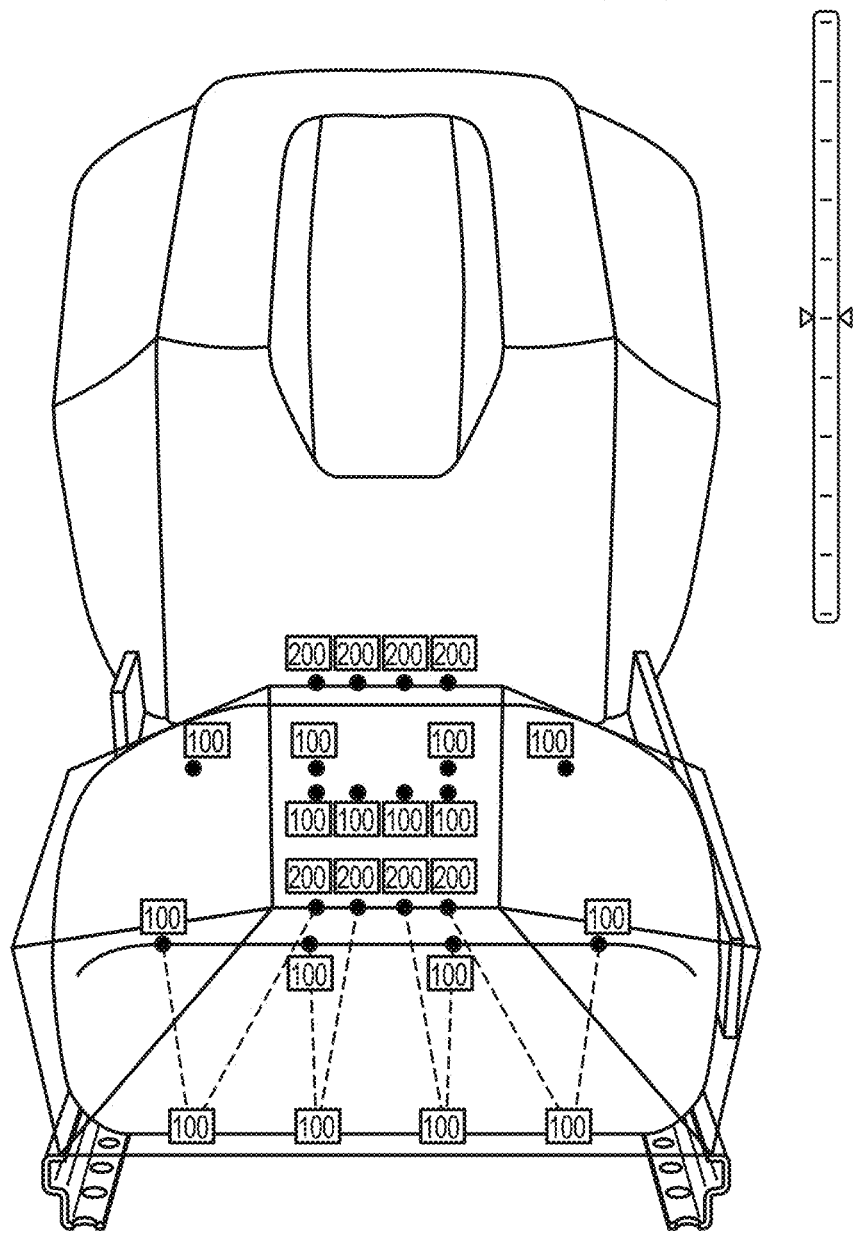
Figure 4D:
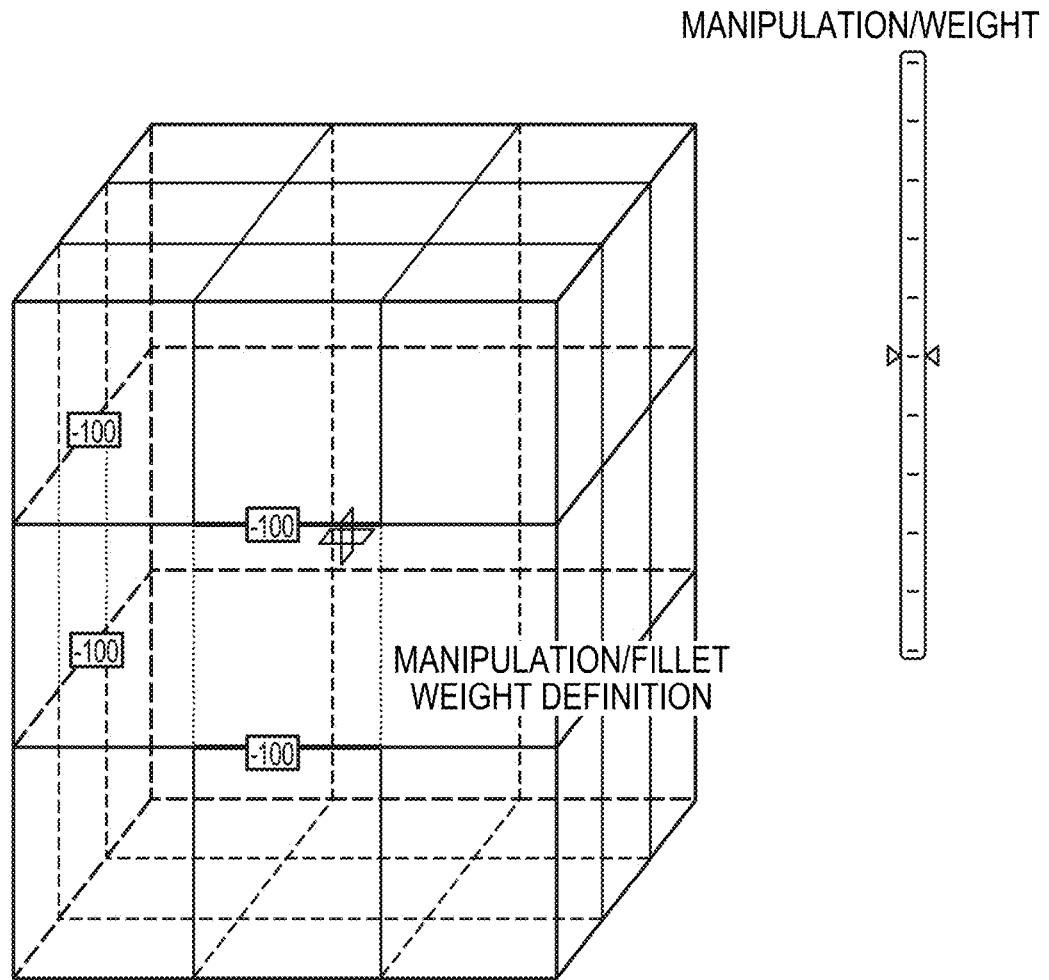
Figure 4E:
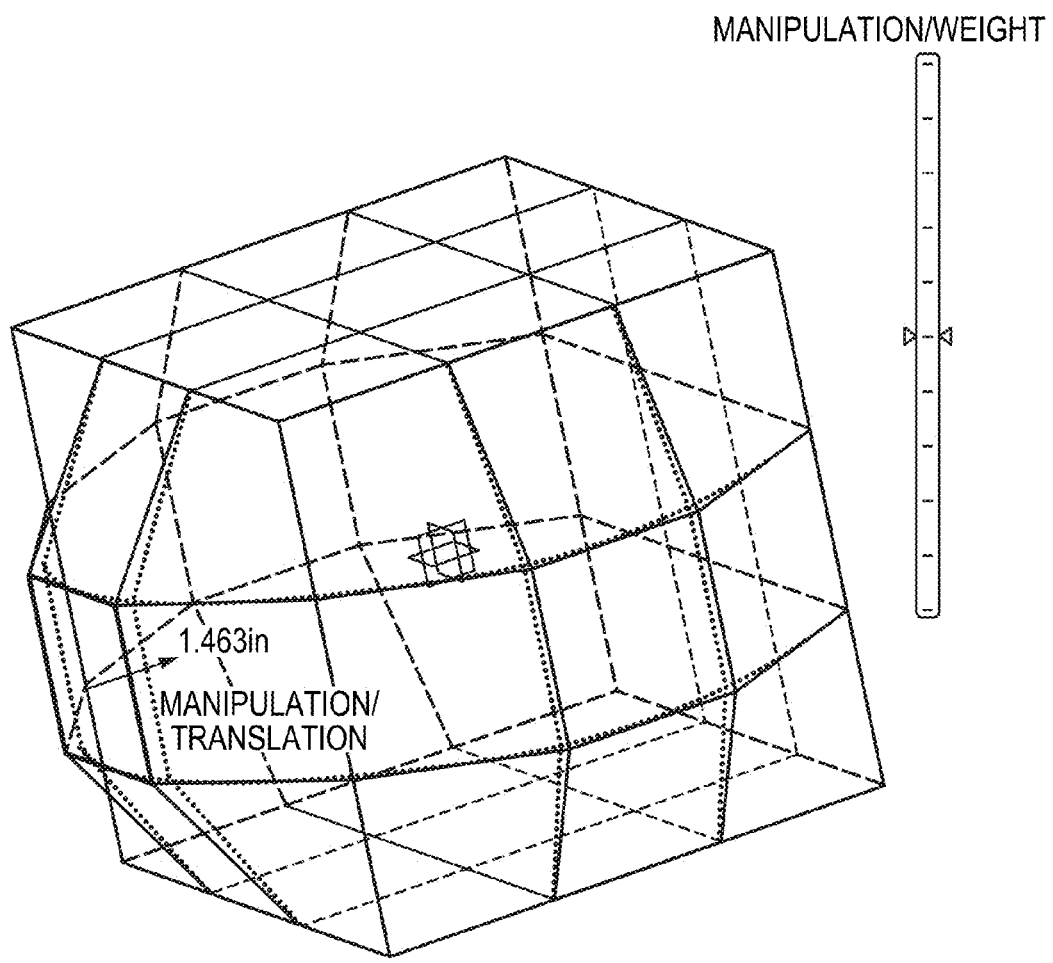

FIG. 4A is a flowchart depicting an example method 400 of virtual clay modeling of surfaces of physical real-world objects in embodiments of the present invention. In some embodiments, the example method 400 is executed by the computer system 300 of FIGS. 3A-3D. A computer system may execute the method 400 of FIG. 4A to create a new modeled surface of a physical real-world object based on a template of a basic shape (e.g., cube, sphere, or such) loaded from computer memory. A computer system may also execute the method 400 to modify an existing modeled surface of a physical real-world object loaded from computer memory. Method 400 begins at step 420 by the computer system displaying the modeled surface (i.e., a template of a basic shape or an existing modeled surface) on the user interface of a computer configured as part of the computer system. In the embodiment of FIG. 4A, the displayed modeled interface is represented in 3D space, but in other embodiments, the displayed modeled interface may be represented in 2D space. Also configured as part of the computer system is an input device communicatively coupled to the computer by a connection interface. The connection interface may be any communication interface known in the art, including wired, wireless, and Bluetooth interfaces. In some example embodiments, the connection interface of the input device is the USB connection interface 350 of FIGS. 3A-3D, which communicatively couples the input device 340 to a respective connection interface 310 of the computer 360 by USB cable 320.

The input device of the computer system comprises a malleable outer surface that corresponds to the modeled surface displayed on the user interface of the computer. Further, the computer system enables the user to connect (via the connection interface) a configuration of the input device that corresponds to the shape on the surface being modeled by the computer system. That is, the malleable outer surface of the input device may comprise the same basic shape in which the modeled surface displayed on the user interface is based from (e.g., the same basic shape as the initial template used to create the displayed modeled surface). For example, if the modeled surface on the user interface is based on a cube shape, the configuration of the input device is respectively selected as a cube shape. For another example, if the modeled surface on the user interface is based on a sphere shape, the configuration of the input device is respectively selected as a sphere shape.

The method continues at step 430 of method 400 by a user (e.g., human user or machine) providing input to the input device by applying pressure to deform the malleable outer surface of the input device. In other words, the input device receives user input in the form of pressure applied by the user to the malleable outer surface of the input device. The user applies pressure by one or more of: pushing, pulling, poking, squeezing, scraping, sculpting, or assert any other action to deform the malleable outer surface. FIGS. 2F-2H illustrate examples of applying pressure to deform the malleable outer surface of the input device in some embodiments of the present invention. In some embodiments, the user applying pressure to the malleable outer surfaces may simulate the act of molding with clay.

At step 440 of method 400, the input device, then, measures the pressure applied to deform the malleable outer surface of the input device using transducers positioned below the malleable outer surface. In some embodiments, the transducers may be piezoelectric transducer, and, in other embodiments, the transducers may be one or more other sensors known in the art for measuring pressure. In example embodiments, the transducers may be arranged in an array or grid (e.g., a grid of piezoelectric chips) coupled to the malleable outer surface, such that the transducers may measure the magnitude, direction, depth, location, and other such parameters defining the various points or areas of pressure applied to deform the malleable outer surface. In other example embodiments, the transducers may be arrange in other formations coupled, or otherwise detecting applied pressure, to the malleable outer surface, such that the transducers may similarly measure the magnitude, direction, location, and other parameters defining the various points or areas of pressure applied to deform the malleable outer surface. In some of these example embodiments, the transducers may be optimally placed to measure the applied pressure to the malleable outer surface, similar to the optimal placement of collocated piezoelectric sensors on a thin flexible plate as disclosed in the publication "An optimization approach to optimal placement of collocated piezoelectric actuators and sensors on a thin plate," by Dunant Hamlin et al., Department of Electrical and Computer Engineering, NSW 2308, University of Newcastle, Australia, Accepted 4 Jul. 2001, Mechatronics 13 (2003), pages 27-47.

At step 450 of method 400, the input device further determines displacement of the malleable outer surface based on the measured pressure using a processor communicatively coupled to the transducers. That is, in the embodiment of method 400, the one or more transducers may communicate the measured pressure to the processor, and, at the processor, the measured pressure may be converted to displacement values by mapping the measured pressure to linear or non-linear coordinates. For example, using the electric output, a measured pressure point may be mapped to an x-component and a y-component and the measured pressure spreading radially outward from the applied pressure point may be mapped to an array of z-components. The mapping to the x,y, and z components may be based on the magnitude, direction, location, and other such parameters defining the measured pressure point. The following two pseudo-code examples may be used as part of determining displacement values from the measured pressure. The pseudo-code of these examples may be stored in memory at the input device, and executed by the processor to retrieve the pressure measurements from the piezoelectric transducers (example 1) and structure the pressure measurements into displacement values (example 2).

EXAMPLE 1

```
INT_PTR CALLBACK D_DP(HWND hh,UINT mm,WPARAM ww,LPARAM ll)
{
  HWND hT = GetDlgItem(hh,701);
  HWND hL2 = GetDlgItem(hh,902);
  static SENSOR::PIEZO_ELECTRIC_ARRAY_SENSOR* ls = 0;
  switch (mm)
  {
    case WM_INITDIALOG:
    {
      SetClassLongPtr (hh,GCLP_HICONSM, (LONG_PTR) hIcon1);
      SetClassLongPtr (hh,GCLP_HICON, (LONG_PTR) hIcon1);
      if (!SENSOR::InitializeSensorManager( ))
      {
        EndDialog(hh,-1);
        break;
      }
      // Install the PIEZO_ELECTRIC_ARRAY_SENSOR, giving it our HWND
      and a custom message
        ls = new SENSOR:: PIEZO_ELECTRIC_ARRAY_SENSOR (hh,WM_USER);
      break;
    }
    case WM_USER:
    {
      // Sent by PIEZO_ELECTRIC_ARRAY_SENSOR.
      // ww == 0 -> ll == address of a SENSOR_DATA containing the
    sensor data
      // ww == 1 -> Sensor is disabled
      // ww == 2 -> State changed, ll = the new SensorState
      if (ww == 0)
      {
        SENSOR::SENSOR_DATA* data = (SENSOR::SENSOR_DATA*)ll
        if (data)
        {
          for (unsigned int i = 0 ; i < data->Num ; i++)
```

-continued

```
          {
            if (data->keys[i] == SENSOR_DATA_TYPE
    PIEZO_ELECTRIC_ARRAY_SENSOR)
            {
              TCHAR x[100];
              _stprintf(x, _T("Lux: %f"),data->data[i].fltVal);
              SetDlgItemText(hh,701,x);
            }
          }
        }
      }
      return 0;
    }
    case WM_CLOSE:
    {
      delete ls;
      SENSOR::FreeSensorManager( );
      EndDialog(hh,0);
      return 0;
    }
  }
  return 0;
}
```

EXAMPLE 2

```
typedef struct tagMOUSEMOVEPOINT {
  int          x;
  int          y;
  int          z;{[ z1, z2, x..., zN]
  DWORD        time;
  ULONG_PTR dwExtraInfo;
} MOUSEMOVEPOINT, *PMOUSEMOVEPOINT;
```

In other embodiments, using the measured pressure, an applied pressure point may be mapped to displacement values by the use of matrixes, non-linear equations, derivatives, or any other such mathematical representation. In some embodiments, the one or more transducers may instead map the sensor measurements to displacement values (e.g., linear or non-linear coordinates), and, then, these displacement values (rather than the measured pressure) are communicated to the processor. The determined displacement over one or more points, periods, and the like, of applied pressure may be combined into a data structure. Further, one or more determined displacements or data structure of determined displacements may be temporarily stored in memory on, or coupled to, the processor.

At step 460 of method 400, the input device transmits the determined displacement over a communication interface to the computer. In some embodiments, the processor may send the determined displacement as the processor receives the measured pressure from the transducers, or in other embodiments, the process may periodically retrieve and send one or more determined displacements or data structure of determined displacements temporarily stored in memory. The processor may send the determined displacement or the data structure of determined displacements to the computer over the standard connection interface using standard protocols respective to the connection interface, such as USB, Human Interface Device, or PS/2 protocol. In some embodiments, the processor may send the measured pressure from the transducers directly to the computer, rather than the determined displacement, and then the computer (instead of the input device) determines the displacement based on the measured pressure applied at the malleable outer surface.

At step 470 of method 400, the computer receives the determined displacement, and converts the determined displacement to a corresponding displacement of the displayed modeled surface on the user interface. Specifically, the computer receives the determined displacement at the standard connection interface and a mapping interface (e.g., an operating system or application level software interface) maps the received displacement to corresponding displacement of the displayed modeled surface on the user interface. The mapping interface performs the mapping based on configured parameters related to the input device, such as its shape, dimensions of the input device relative to the displayed modeled surface, its sensitivity of input, and the like, to calculate displacement (e.g., position, direction, depth, and such) of the modeled surface relative to the deforming of the input device. FIGS. 4B-4E illustrate example user interfaces for configuring these parameters that map the received displacement from the user device relative to the displacement of the modeled surface. The computer visually adjusts the displayed modeled surface on the user interface according to the calculated displacement. The computer may further store the adjusted modeled surface, calculated displacement, or both in memory for reloading the modeled surface at a later time.

Malleable Outer Surface of Input Device

Figure 5A:
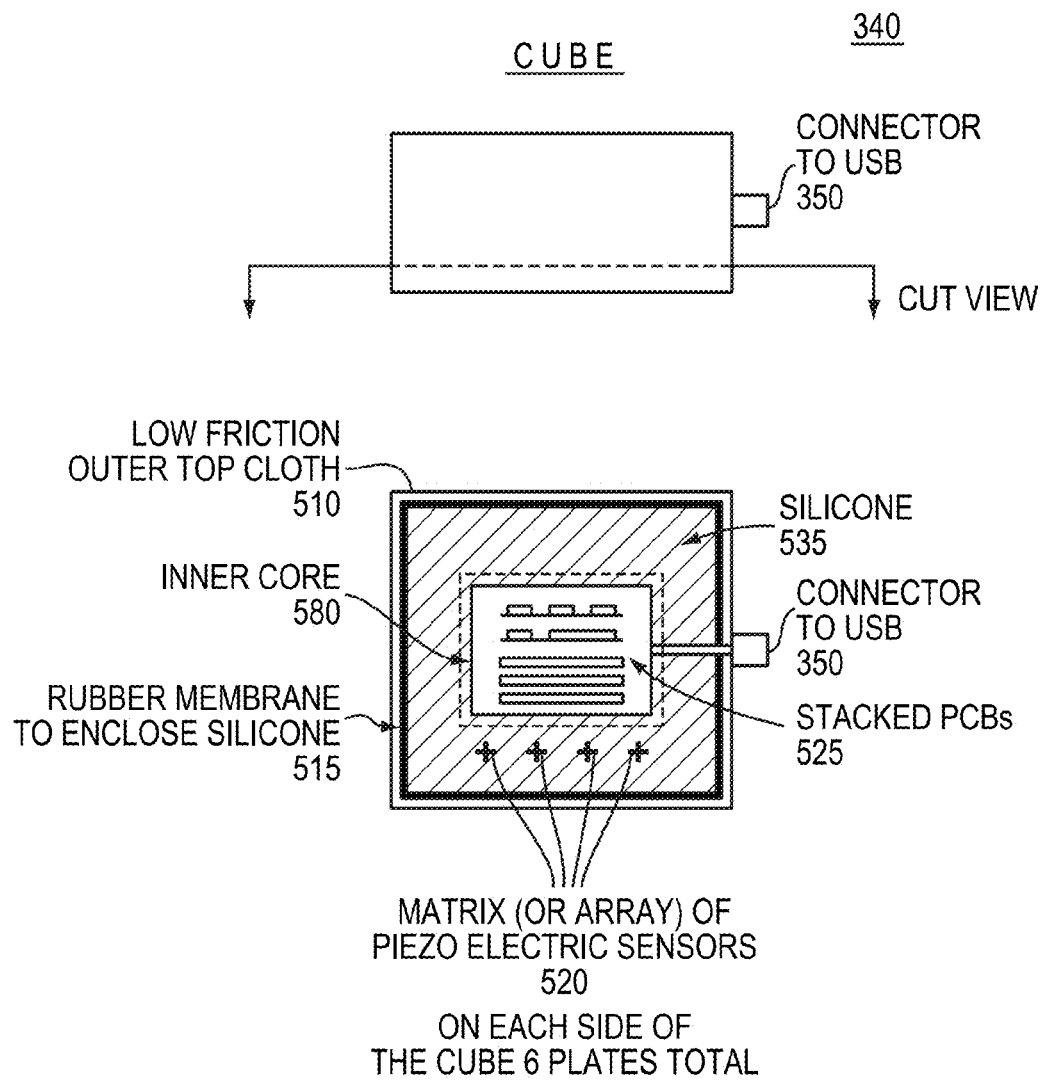
FIGS. 5A-5B are diagrams of example malleable outer surfaces of an input device in embodiments of the present invention.
Figure 5B:
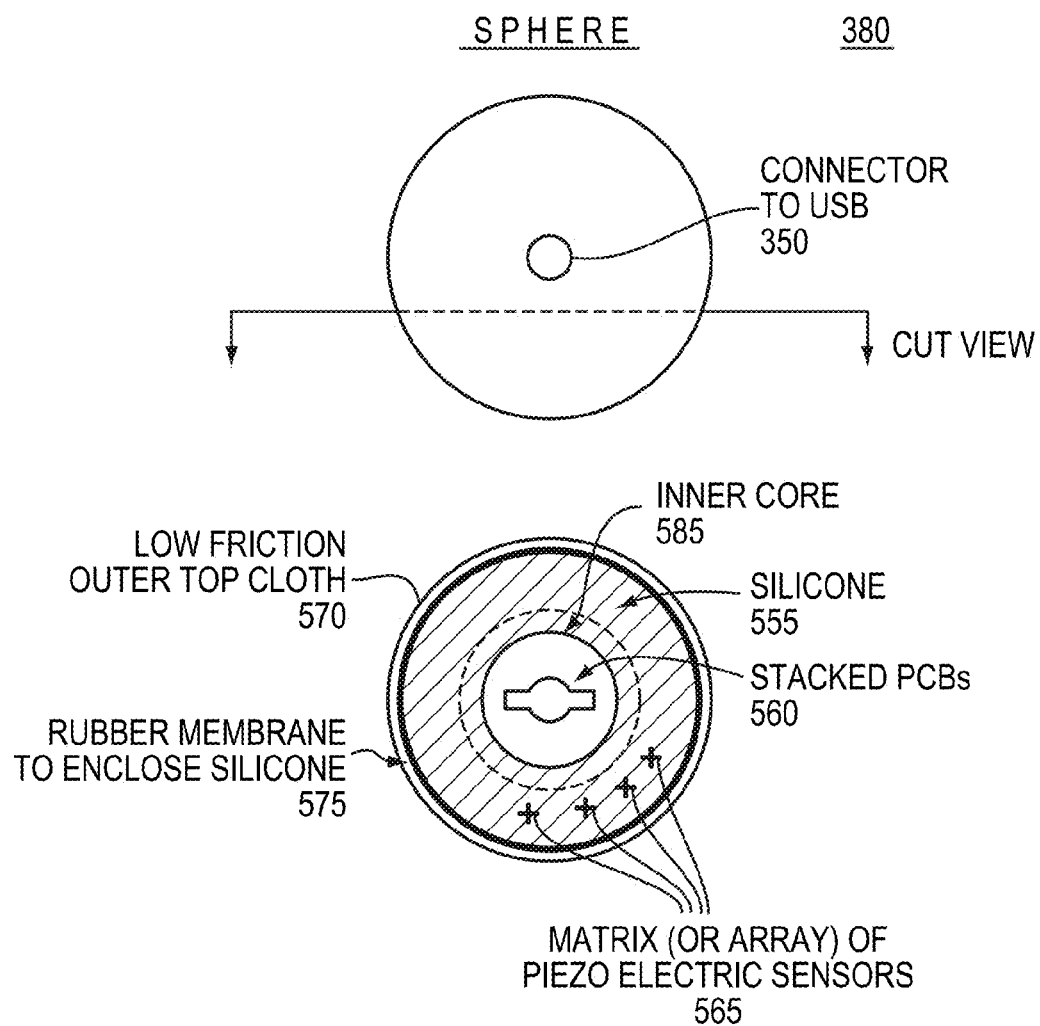

FIGS. 5A and 5B are diagrams of example malleable outer surfaces of input devices in embodiments of the present invention. FIGS. 5A and 5B specifically illustrate cutting open the two configurations (cube and sphere) of an input devices 340, 380 to reveal the internal composition of the malleable outer surface. In this way, FIG. 5A illustrates the malleable outer surface of the cube configured input device 340 composed of a low friction outer top cloth 510, which covers the outer side of a rubber membrane 515, enclosing silicone gel 535 (of different densities). The rubber membrane 515, enclosing the silicone gel 535, surrounds an inner core 580 of the same shape (i.e., cube) within input device 340. In some embodiments, the silicone gel 535 may be Technogel, which is a "soft-solid" material that combines 3D deformation of a fluid and the memory shape of a solid. Positioned on each side of the cubic inner core 580 is a matrix or array of piezoelectric sensors 520 arranged on a square plate (not shown). Note, Six plates in total surround cubic inner core 580 (one on each side), however, FIG. 5A only shows the matrix or array of piezoelectric sensors 520 (on a plate, not shown) on one side of the cubic inner core 580 for illustrative purposes. The cubic inner core 580 houses stacked print circuit boards (PCBs) 525 configured with processing and memory components of the input device 340, which are coupled to the USB connection interface 350 for transmitting processed/stored data from the cubic inner core 580 of the input device.

Similarly, FIG. 5B illustrates the malleable outer surface of the sphere configured input device 380 composed of a low friction outer top cloth 570, which covers the outer side of a rubber membrane 575, enclosing silicone gel 555 (of different densities). The rubber membrane 575, enclosing the silicone gel 555, surrounds an inner core 585 of the same shape (i.e., sphere) within input device 380. In some embodiments, the silicone gel 535 may be Technogel, which is a "soft-solid" material that combines 3D deformation of a fluid and the memory shape of a solid. Positioned around the spherical inner core 585 is a matrix or array of piezoelectric sensors 565 arranged on plating (not shown) surrounding the spherical inner core 585. Note, FIG. 5B only shows the matrix or array of piezoelectric sensors 565 (on the plating, not shown) partially surrounding the spherical inner core 585 for illustrative purposes. The spherical inner core 585 houses stacked PCBs 560 configured with processing and memory components of the input device 380, which are coupled to a connection interface 350 for transmitting processed/stored data from the spherical inner core 585 of the input device 380. In other embodiments, the malleable outer surface of the input devices of FIGS. 5A and 5B may be composed of different materials, such as a thin rubber membrane surrounding a fine powder with malleable properties suited to provide a level of resistance within the rubber membrane, closed-cell polyurethane foam rubber, or any other such material that enables a user to apply pressure to deform the material. In all of these embodiments, the malleable outer surface provides a user the sensation and control of modeling with real clay, so that the user, like a sculptor, may push, pull, poke, squeeze, scrape, and otherwise sculpt the malleable outer surface, which is detected as pressure measurements by the input device 340, 380.

Internal Structure of Input Device

Figure 6:
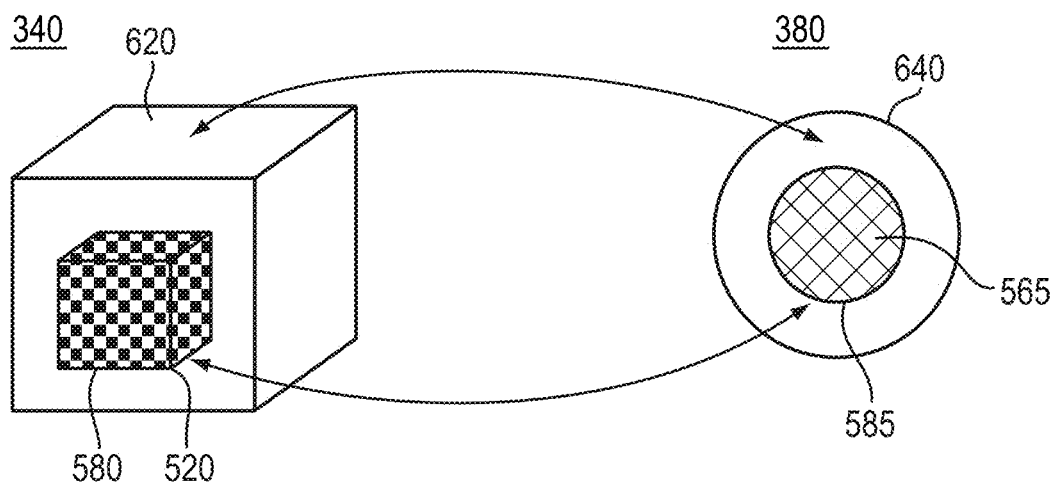
FIG. 6 is a diagram of example grids of transducers positioned inside an input device in embodiments of the present invention.

FIG. 6 is a diagram of example grids of transducers positioned inside an input device in embodiments of the present invention. FIG. 6 illustrates two example configurations of the input device, the cube configuration 340 and the sphere configuration 380. Each configuration includes an inner core 580, 585 which house electronic components (e.g., processors, connection interfaces, and such) of the input device 340, 380, and a malleable outer surface 620, 640 that surround the inner core 580, 585. In some embodiments, the malleable outer surface 620 corresponds to the malleable outer surface of FIG. 5A, and the malleable outer surface 640 corresponds to the malleable outer surface of FIG. 5B. The inner core 580, 585 composes the same basic shape as the configuration of the input device 340, 380 (e.g., cube, sphere, or such) and the malleable outer surface 620, 640 surrounds the inner core 580, 585 to take the form of that same basic shape.

Positioned between the inner core 580, 585 and the malleable outer surface 620, 640 is a matrix or array of transducers 520, 565 (e.g., piezoelectric chips or other pressure sensor chips) positioned on plating to surround the inner core 580, 585. The matrix or array of transducers 520, 565 are positioned in this manner, so that the transducers may both measure the pressure applied to the malleable outer surface 620, 640 and communicate the measured pressure to a processor positioned inside the inner core 580, 585. In the embodiment of FIG. 6, the transducers are configured as a matrix or array so that the transducers are optimally aligned across the entire malleable outer surface 620, 640 to optimally measure the various points or areas of pressure applied to deform the malleable outer surface. In other embodiments, the transducers may be optimally placed in other configurations that optimally measure the various points or areas of pressure applied to deform the malleable outer surface. In such configurations, the transducers may measure various parameters of the pressure, such as the magnitude, direction, depth, location, and other such parameters.

Figure 7:
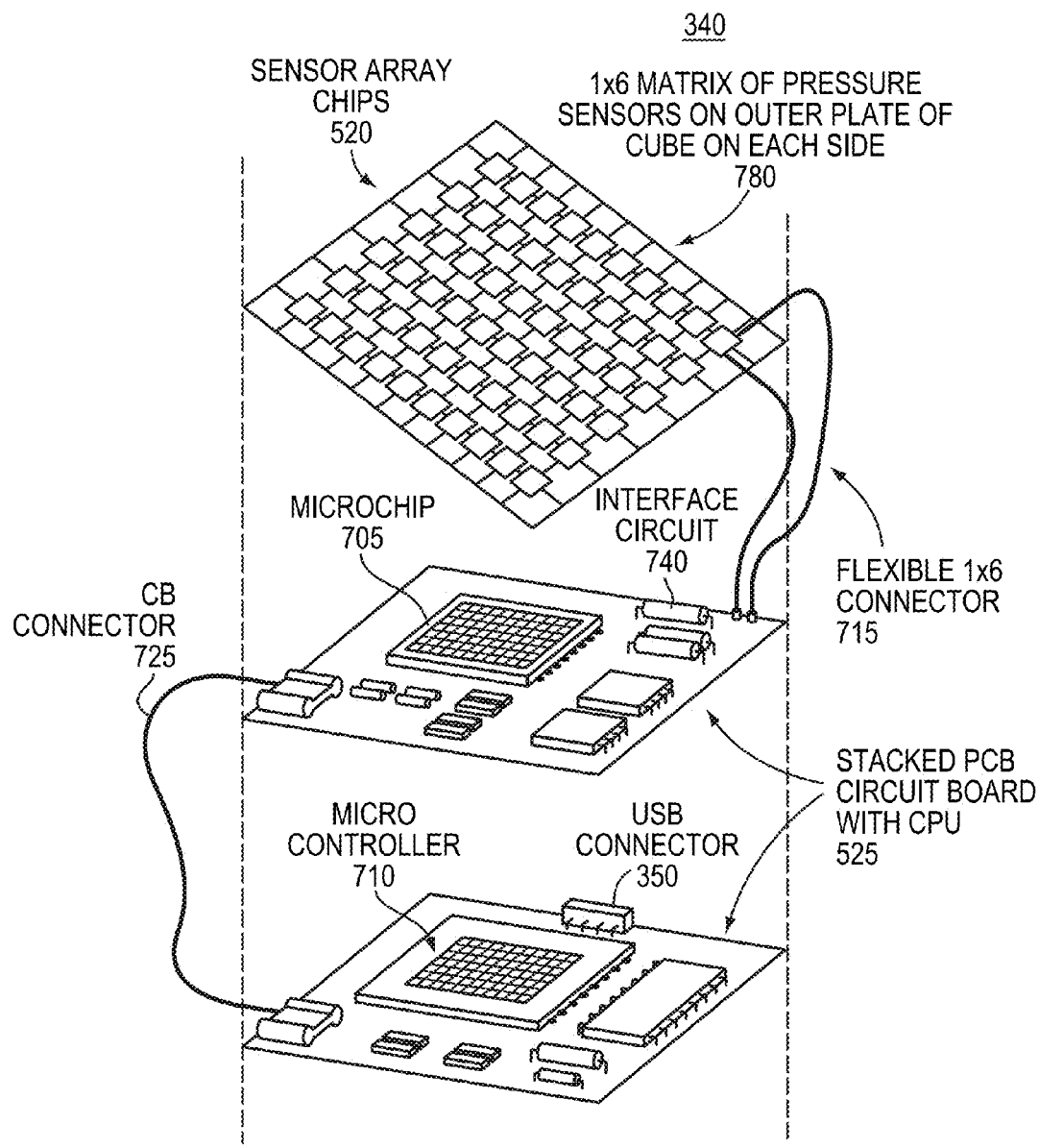
FIG. 7 is a diagram of an example internal structure of an input device in embodiments of the present invention.

FIG. 7 is a diagram of an example internal structure of input device 340 in embodiments of the present invention. The cubic inner core 580 of FIGS. 5A and 6 houses the internal structure of the input device 340, which includes stacked print circuit boards (PCBs) 525 coupled together by circuit board (CB) connection 725. The stacked PCBs 525 are further coupled (via a flexible 1×6 connector 715) to a 1×6 matrix of pressure sensors (i.e., sensor array chips 520) positioned on a square outer plate 780. For example, for the cube configuration of the input device (as shown in FIG. 7), the matrix of pressure sensors (i.e., sensor array chips 520) are positioned on a square outer plate 780 positioned on each side of the cubic inner core 580 that houses the internal structure of input device 340. The sensor array chips 520 measure applied pressure to the malleable outer surface of the input device 340. The PCBs 525 are configured as a microcontroller environments, including a microchip 705 and microcontroller 710, for receiving and processing the measured pressure received from the matrix of pressure sensors 520 (via connector 715). The microcontroller 710, in conjunction with other auxiliary processors and connectors comprising the microcontroller environment of the stacked PCBs 525, are specifically configured to map the measured pressure to linear or non-linear displacement coordinates. The microcontroller environment of the stacked PCBs 525 may also comprise memory that may be used to store instructions to execute this mapping and may also be used to temporarily store the mapped displacement.

The internal structure of input device 340 also includes a connection interface 350 that is communicatively coupled (via interface circuit 740) to the microcontroller environment of the stacked PCBs 525. The microcontroller 710, in conjunction with other auxiliary processors and connectors comprising the microcontroller environment, may format the mapped displacement values into packets or other communication format to be communicated over the USB connection interface 350 using a respective communication protocol. In some embodiments, the input device may not only measure applied pressure to the malleable outer surface, but may also detect movement by scrolling wheels or light sensors incorporated into the input device. In these embodiments, the detected movement may also be communicated to the microcontroller environment of the stacked PCBs 525 for determining displacement of the input device 340, which may be similarly communicated from the connection interface 350.

Digital Processing Environment

Figure 8:
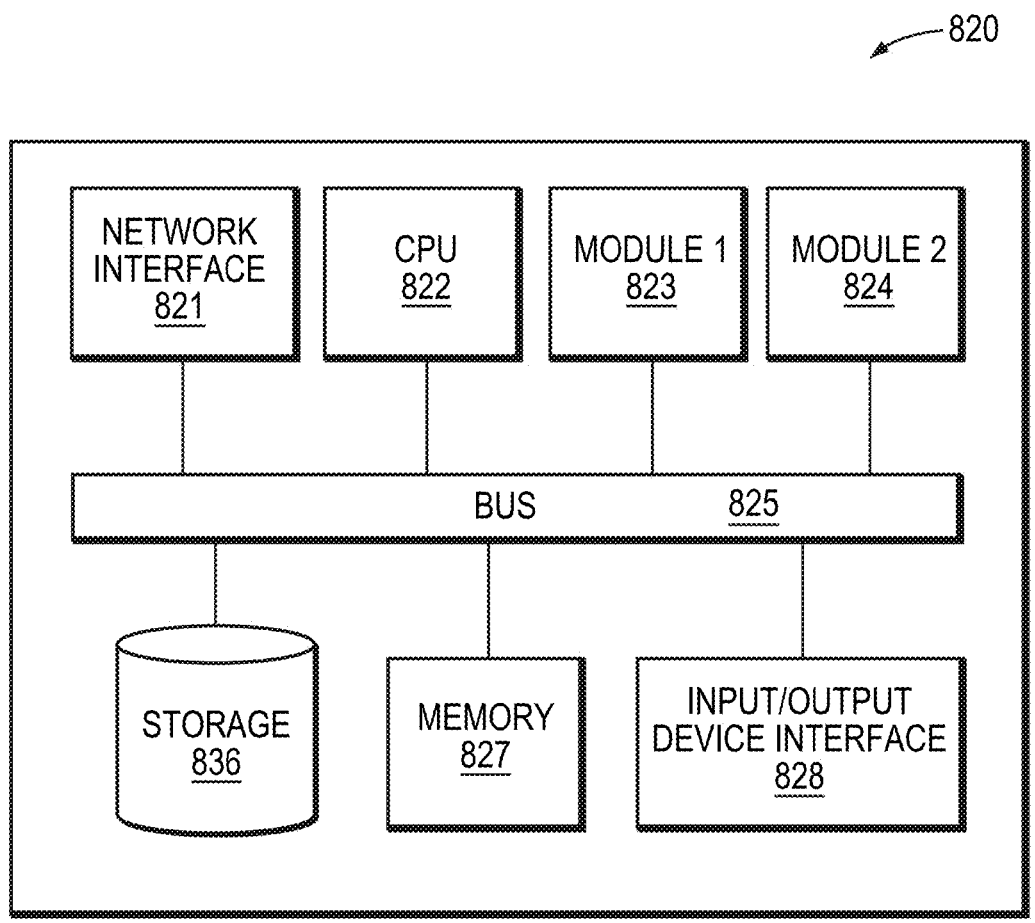
FIG. 8 is a block diagram of a computer (or digital processing) system for modeling surfaces of physical real-world objects in embodiments of the present invention.

FIG. 8 is a simplified block diagram of a computer-based system 820 that may be used to model complex surfaces of real-world objects according to an embodiment of the present invention. The system 820 comprises a bus 825. The bus 825 serves as an interconnector between the various components of the system 820. Connected to the bus 825 is an input/output device interface 828 for connecting various input and output devices such as a keyboard, mouse, display, speakers, etc. to the system 820. The input/output device interface 828 may be used to connect the input device 340, 380 of the present invention, as shown in FIGS. 5-7, within the computer system of present invention, as shown in FIGS. 3A-3D. Input/output device interface 828 also connects the display monitor, such as at 362 in FIGS. 3A-3D, to the system 820. A central processing unit (CPU) 822 is connected to the bus 825 and provides for the execution of computer instructions. Memory 827 provides volatile storage for data used for carrying out computer instructions. Storage 826 provides non-volatile storage for software instructions, such as an operating system (not shown). In particular, memory 827 and/or storage 826 are configured with program instructions implementing method 400 for modeling complex surfaces detailed above in FIG. 4A. The system 820 also comprises a network interface 821 for connecting to any variety of networks known in the art, including cloud, wide area networks (WANs) and local area networks (LANs).

Further connected to the bus 825 is a first module 823. The first module 823 is configured to load a modeled surface of a physical real-world object for display on a user interface of a computer. The first module 823 may provide loading and display functions through any means known in the art. For example, the first module 823 may reference modeled surface data that is stored on the storage device 826 or memory 827. For further example, the first module 823 may load the modeled surface data from any point communicatively coupled to the system 820 via the network interface 821 and/or input/output device interface 828.

The system 820 further comprises a second module 824 that is communicatively/operatively coupled to the first module 823. The second module 824 is configured to convert a determined displacement of the malleable outer surface of an input device (FIG. 5), as received from input/output device interface 828, to a corresponding displacement of the displayed model surface on the user interface of the computer system (element 362 of FIGS. 3A-3C). The second module 824 may provide conversion functions through any means known in the art. For example, the second module 824 may store determined displacement values of the malleable outer surface or corresponding displacement values of the displayed modeled surface at the storage device 826 or memory 827. For another example, the second module 824 may calculate the corresponding displacement values of the displayed modeled surface by means of the CPU 822 via the bus 825. For further example, the second module 824 may receive the determined displacement values of the malleable outer surface from any point communicatively coupled to the system 820 via the network interface 821 and/or input/output device interface 828 (e.g., connection interface 310 of FIGS. 3A-3D).

It should be understood that the example embodiments described herein may be implemented in many different ways. In some instances, the various methods, systems, and devices described herein may each be implemented by a physical, virtual, or hybrid general purpose computer, such as the computer system 820. The computer system 820 may be transformed into the machines that execute the methods described herein, for example, by loading software instructions into either memory 827 or non-volatile storage 826 for execution by the CPU 822. Further, while the first module 823 and second module 824 are shown as separate modules, in an example embodiment these modules may be implemented using a variety of configurations.

The system 820 and its various components may be configured to carry out any embodiments of the present invention described herein. For example, the system 820 may be configured to carry out the method 400 described hereinabove in relation to FIG. 4A. In an example embodiment, the first module 823 and second module 824 may be implemented in software that is stored on the memory 827 and/or storage device 826. In such an example embodiment, the CPU 822 and the memory 827 with computer code instructions stored on the memory 827 and/or storage device 826 implement a first module that loads and displays a modeled surface of a physical real-world object. Further, the components of the system 820 implement a second module that is operatively coupled to the first module and configured to provide conversion of the determined displacement values of the malleable outer surface to corresponding displacement values of the displayed modeled surface.

Figure 9:
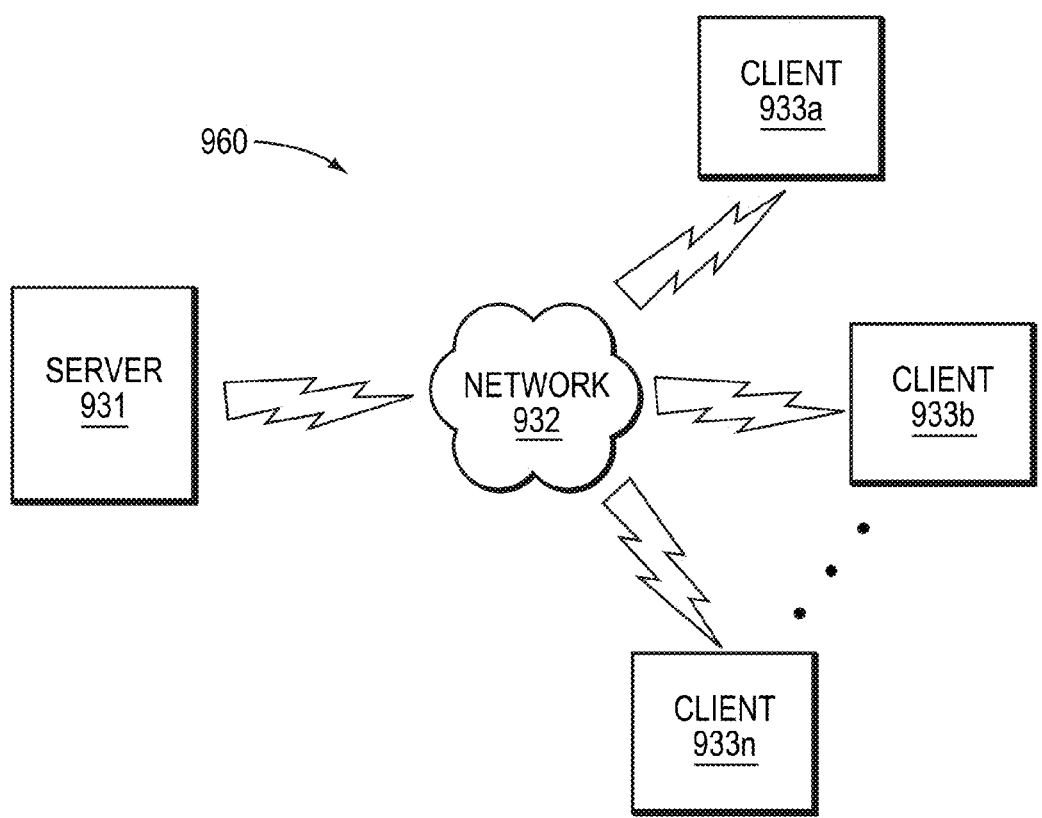
FIG. 9 is a schematic diagram of an example computer network environment in which embodiments of the invention may be implemented.

FIG. 9 illustrates a computer network environment 960 in which an embodiment of the present invention may be implemented. In the computer network environment 960, the server 931 is linked through the communications network 932 to the clients 933*a-n*. The environment 960 may be used to allow the clients 933*a-n*, alone or in combination with server 931, to execute any of the methods described hereinabove (e.g., method 400 of FIG. 4A). It should be understood that the example embodiments described above may be implemented in many different ways. In some instances, the various methods and machines described herein may each be implemented by a physical, virtual, or hybrid general purpose computer, or a computer network environment such as the computer environment 960.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. An input device for modeling complex surfaces in a computer-aided design (CAD) system, the device comprising:
    a malleable outer surface that corresponds to a modeled surface displayed on a user interface of a computer, wherein the malleable outer surface surrounds a volume in three-dimensional space and is composed uniformly of malleable materials deformable to enable a user to: (i) provide input to said input device by applying pressure to the malleable outer surface in total and (ii) alter shape of said input device in three-dimensional space including deforming the malleable outer surface, such that the altering of the shape of said input device mimics molding with clay, and deforming the malleable outer surface serves as a simulation of shaping the displayed modeled surface, wherein the deforming of the malleable outer surface simulates to the user molding the displayed modeled surface as clay directly on the user interface;
    one or more transducers operatively coupled to the malleable outer surface, the one or more transducers configured to measure the pressure applied to deform the malleable outer surface;
    a processor operatively coupled to the one or more transducers, the processor configured to determine displacement of the malleable outer surface based on the measured pressure; and
    a connection interface communicatively coupled to the processor, the connection interface configured to transmit the determined displacement to the computer to effect shape of the displayed modeled surface in accordance with the deforming of the malleable outer surface.

2. The input device of claim 1, wherein the one or more transducers is a piezoelectric transducer.

3. The input device of claim 2, wherein the one or more transducers are arranged in an array or grid below the malleable outer surface, such that the transducers measure various points of pressure applied to deform the malleable outer surface.

4. The input device of claim 1, wherein the displayed modeled surface is represented in 3D space.

5. The input device of claim 1, wherein the user input deforms the malleable outer surface by at least one of: pushing, pulling, poking, squeezing, scraping, and sculpting the malleable outer surface.

6. The input device of claim 1, wherein the malleable outer surface is composed of: (i) silicone gel of different densities inside a rubber skin, (ii) a thin rubber membrane surrounding a fine powder, or (iii) closed-cell polyurethane foam rubber.

7. The input device of claim 1, wherein the input device further comprises a basic shape that is reflected by the displayed modeled surface on the user interface of the computer.

8. A computer system for modeling complex surfaces, the computer system comprising:
    a computer communicatively coupled to a user interface, the computer configured to display a modeled surface on the user interface;
    an input device communicatively coupled to the computer by a connection interface, the input device comprising:
        a malleable outer surface that corresponds to the displayed modeled surface, wherein the malleable outer surface surrounds a volume in three-dimensional space and is composed uniformly of malleable materials deformable to enable a user to: (i) provide input to the input device by applying pressure to the malleable outer surface in total and (ii) alter shape of said input device in three-dimensional space including deforming the malleable outer surface, such that the altering of the shape of said input device mimics molding with clay, and deforming the malleable outer surface serves as a simulation of shaping the displayed modeled surface, wherein the deforming of the malleable outer surface simulates to the user molding the displayed modeled surface as clay directly on the user interface,
        one or more transducers operatively coupled to the malleable outer surface, the one or more transducers configured to measure the pressure applied to deform the malleable outer surface,
        a processor operatively coupled to the one or more transducers, the processor configured to determine displacement of the malleable outer surface based on the measured pressure, and
        the connection interface communicatively coupled to the processor, the connection interface configured to transmit the determined displacement to the computer; and the computer further configured to: (i) receive the determined displacement from the connection interface and (ii) convert the determined displacement to a corresponding displacement of the displayed modeled surface, such that shape of the displayed modeled surface is updated on the user interface to reflect the deforming of the malleable outer surface.

9. The computer system of claim 8, wherein the one or more transducers is a piezoelectric transducer.

10. The computer system of claim 9, wherein the one or more transducers are arranged in an array or grid below the malleable outer surface, such that the transducers measure various points of pressure applied to deform the malleable outer surface.

11. The computer system of claim 8, wherein the displayed modeled surface is represented in 3D space.

12. The computer system of claim 8, wherein the user input deforms the malleable outer surface by at least one of: pushing, pulling, poking, squeezing, scraping, and sculpting the malleable outer surface.

13. The computer system of claim 8, wherein the malleable outer surface is composed of: (i) silicone gel of different densities inside a rubber skin, (ii) a thin rubber membrane surrounding a fine powder, or (iii) closed-cell polyurethane foam rubber.

14. The computer system of claim 8, wherein the input device further comprises a basic shape that is reflected by the displayed modeled surface on the user interface of the computer.

15. The computer system of claim 8, wherein the computer further configured to convert the determined displacement by:
calculating the corresponding displacement of the displayed modeled surface by mapping the determined displacement of the malleable outer surface to a respective position on the displayed modeled surface; and
visually adjusting the shape of the displayed modeled surface according to the calculated displacement.

16. A computer-implemented method for modeling complex surfaces in a computer aided design (CAD) model, the method comprising:
receiving input by an input device communicatively coupled to a computer that displays a CAD modeled surface, the input being provided by a user applying pressure to deform in total a malleable outer surface of the input device, the malleable outer surface surrounding a volume in three-dimensional space and being composed uniformly of malleable materials deformable under pressure, the malleable materials enabling the user input to alter shape of said input device in three-dimensional space including deforming the malleable outer surface, such that the altering of the shape of said input device mimics molding with clay, and deforming the malleable outer surface serves as a simulation of shaping the displayed modeled surface, wherein the deforming of the malleable outer surface simulates to the user molding the displayed CAD modeled surface as clay directly on a user interface of the computer;
measuring the pressure applied to deform the malleable outer surface of the input device, the measuring performed by one or more transducers positioned inside the input device;
determining displacement of the malleable outer surface based on the measured pressure, the determining performed by at least one processor communicatively coupled to the one or more transducers inside the input device; and
transmitting the determined displacement to the computer to facilitate updating shape of the displayed modeled surface to reflect the deforming of the malleable outer surface.

17. The method of claim 16, wherein the one or more transducers is a piezoelectric transducer.

18. The method of claim 16, wherein the input deforms the malleable outer surface by at least one of: pushing, pulling, poking, squeezing, scraping, and sculpting the malleable outer surface.

19. The method of claim 16, wherein the input device further comprises a basic shape that is reflected by the displayed modeled surface on the user interface of the computer.

20. The method of claim 16, wherein the malleable outer surface is composed of: (i) silicone gel of different densities inside a rubber skin, (ii) a thin rubber membrane surrounding a fine powder, or (iii) closed-cell polyurethane foam rubber.

* * * * *